(12) United States Patent  
Higashi (10) Patent No.: US 12,237,164 B2  
(45) Date of Patent: Feb. 25, 2025

(54) METHOD OF MANUFACTURING ELECTRODE PLATE FOR PLASMA PROCESSING DEVICE AND ELECTRODE PLATE FOR PLASMA PROCESSING DEVICE

(71) Applicant: MITSUBISHI MATERIALS CORPORATION, Tokyo (JP)

(72) Inventor: Koji Higashi, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 206 days.

(21) Appl. No.: 17/800,602

(22) PCT Filed: Jan. 5, 2021

(86) PCT No.: PCT/JP2021/000074  
§ 371 (c)(1),  
(2) Date: Aug. 18, 2022

(87) PCT Pub. No.: WO2021/192481  
PCT Pub. Date: Sep. 30, 2021

(65) Prior Publication Data  
US 2023/0077433 A1 Mar. 16, 2023

(30) Foreign Application Priority Data  
Mar. 24, 2020 (JP) .................. 2020-053222

(51) Int. Cl.  
*H01J 9/02* (2006.01)  
*H01J 37/32* (2006.01)

(52) U.S. Cl.  
CPC .......... *H01J 9/02* (2013.01); *H01J 37/32541* (2013.01)

(58) Field of Classification Search  
None  
See application file for complete search history.

(56) References Cited

U.S. PATENT DOCUMENTS

2003/0209323 A1 11/2003 Yokogaki  
2009/0000742 A1 1/2009 Okesaku et al.

FOREIGN PATENT DOCUMENTS

JP H10-050677 A 2/1998  
JP H10-286708 A 10/1998  
(Continued)

OTHER PUBLICATIONS

JP 2001-102357 A (Year: 2024).*  
(Continued)

*Primary Examiner* — Hoa C Nguyen  
*Assistant Examiner* — John B Freal  
(74) *Attorney, Agent, or Firm* — Troutman Pepper Locke LLP (57) ABSTRACT

Provided is a method of manufacturing an electrode plate for a plasma processing apparatus for forming a plurality of gas holes having a straight portion exceeding 12 mm in length in a thickness direction of an electrode plate main body in a penetrating state and in parallel to each other, the method including: a prepared hole forming step of forming a prepared hole with a diameter of 50% or more and 80% or less of a diameter of a hole forming the straight portion with a first drill from one surface of the electrode plate main body; and a straight portion forming step of forming the straight portion to overlap the prepared hole with a second drill.

18 Claims, 8 Drawing Sheets

(56) References Cited

FOREIGN PATENT DOCUMENTS

| | | | |
|---|---|---|---|
| JP | 2001102357 A | * | 4/2001 |
| JP | 2003-238178 A | | 8/2003 |
| JP | 2003-324072 A | | 11/2003 |
| JP | 2008-311297 A | | 12/2008 |
| JP | 2009149471 A | * | 7/2009 |
| JP | 2012-119590 A | | 6/2012 |
| WO | 2006/112392 A1 | | 10/2006 |

OTHER PUBLICATIONS

JP 2009-149471 A (Year: 2024).*
International Search Report mailed Feb. 2, 2021, issued for PCT/JP2021/000074 and English translation thereof.

* cited by examiner

METHOD OF MANUFACTURING ELECTRODE PLATE FOR PLASMA PROCESSING DEVICE AND ELECTRODE PLATE FOR PLASMA PROCESSING DEVICE

TECHNICAL FIELD

The present disclosure relates to a method of manufacturing an electrode plate for a plasma processing apparatus and an electrode plate for a plasma processing apparatus.

Priority is claimed on Japanese Patent Application No. 2020-053222, filed Mar. 24, 2020, the content of which is incorporated herein by reference.

BACKGROUND ART

In a plasma processing apparatus such as a plasma etching device and a plasma CVD device used in a semiconductor device manufacturing process, an upper electrode and a lower electrode connected to a high-frequency power source are disposed in a chamber so as to, for example, face each other in the vertical direction. The lower electrode is in a state where a substrate to be processed is disposed thereon, the upper electrode has a ventilation hole, and a high-frequency voltage is applied during etching gas flow from the ventilation hole toward the substrate to be processed. The plasma processing apparatus is configured to generate plasma as a result and perform processing such as etching on the substrate to be processed.

Patent Document 1 discloses an electrode plate for plasma etching that suppresses particle generation. This electrode plate for plasma etching is provided with a through pore (gas hole) parallel to the thickness direction of the electrode plate made of single crystal silicon. The through pore is configured by a large-diameter straight hole part and a small-diameter straight hole part. According to this electrode plate, large particles are not generated, a decrease in cleaning count can be achieved, and a silicon wafer can be plasma-etched more efficiently than in the related art.

The life of an electrode plate is longer when the plate is thicker. Recently, deep etching may be required as in the case of the multilayer and complex three-dimensional structure of a substrate to be processed (for example, 3D-NAND) and, to that end, an increase in etching gas pressure is required. In this case, gas hole consumption accelerates and an electrode plate with a conventional thickness undergoes a decrease in life. Accordingly, a thick electrode plate is required for life extension.

Although gas hole machining in an electrode plate may be performed by a method such as a drill, a laser, a water jet, and electrical discharge machining, opening by laser machining is limited in depth to several mm (approximately 5 mm). By water jet hole drilling, the shape of the opening portion of a gas hole cannot be machined satisfactorily. Electrical discharge machining cannot be used for non-energizing materials. On the other hand, drilling is exceptional in workability, versatility, and quality.

CITATION LIST

Patent Document

[Patent Document 1]
Japanese Unexamined Patent Application, First Publication No. 2001-102357

SUMMARY OF INVENTION

Technical Problem

However, in the case of, for example, a deep gas hole with a diameter of 0.5 mm to 1.0 mm, the machining load may lead to drill swinging, and then the circularity of the gas hole increases (deteriorates) and the quality of plasma processing may decline.

The present disclosure has been made in view of the above circumstances, and an objective thereof is to provide a method of manufacturing an electrode plate for a plasma processing apparatus by which a small-circularity gas hole can be formed even in a case where a gas hole exceeding 12 mm in depth is machined and an electrode plate for a plasma processing apparatus provided with a small-circularity gas hole.

Solution to Problem

A method of manufacturing an electrode plate for a plasma processing apparatus according to one aspect of the present disclosure is for forming a plurality of gas holes having a straight portion exceeding 12 mm in length in a thickness direction of an electrode plate main body in a penetrating state and in parallel to each other, the method including: a prepared hole forming step of forming a prepared hole with a diameter of 50% or more and 80% or less of a diameter of the straight portion with a first drill from one surface of the electrode plate main body; and a straight portion forming step of forming the straight portion to overlap the prepared hole with a second drill.

According to this method of manufacturing an electrode plate for a plasma processing apparatus, the prepared hole with a diameter of 50% or more and 80% or less of the diameter of the straight portion is formed with the first drill, and then the straight portion is formed with the second drill. Accordingly, hole drilling with the second drill is performed with the small machining load that is the original cutting region of the straight portion as a whole from which the prepared hole cutting region is subtracted. Since the machining load on the second drill is reduced, the accuracy of machining by the second drill is enhanced and a small-circularity straight portion can be formed. In this case, the effect of machining load reduction with respect to the second drill is small at a prepared hole diameter that is less than 50% of the diameter of the straight portion and, at a prepared hole diameter that exceeds 80% of the diameter of the straight portion, the machining load on the small-diameter first drill increases and the first drill may, for example, break.

As the machining depth (electrode plate thickness) increases, the machining load on the drill also increases, and thus drill buckling is likely to occur. Although a single crystal diamond drill, a polycrystalline diamond drill, a sintered body drill, a drill with a refueling port, or the like resistant to buckling strength and machining load may be used in this regard, the risk of machining load-attributable drill breakage can be avoided by the following manufacturing method.

In the manufacturing method according to one aspect of the present disclosure, in the prepared hole forming step, the prepared hole may be formed to a middle of a thickness of the electrode plate main body with the first drill. In this case, the prepared hole may have a machining depth of more than 5 mm.

According to this method of manufacturing an electrode plate for a plasma processing apparatus, before the gas hole is formed in the electrode plate main body, the prepared hole with an inner diameter of 50% or more and 80% or less with respect to the inner diameter of the straight portion of the gas hole is drilled to the middle in the thickness direction. Since the prepared hole may be formed to the middle of the electrode plate main body in the thickness direction, the cutting length of the first drill may be shorter than the thickness of the electrode plate main body. In other words, the first drill for the prepared hole is small in diameter but short and thus hard to break.

In this case, if the length of the prepared hole is 5 mm or less with respect to the straight portion exceeding 12 mm in length, the effect of reducing the machining load attributable to the second drill is small, and thus the length of formation may exceed 5 mm.

The second drill is larger in diameter than the first drill, and hole drilling with the second drill is coaxially performed from, for example, the same direction as the prepared hole with respect to the prepared hole drilled by the first drill. Here, by performing the hole drilling with the second drill coaxially with the prepared hole, the machining load corresponding to the already-removed prepared hole cutting region is reduced. Accordingly, the hole drilling with the second drill can be performed with the small machining load that is the original cutting region of the straight portion as a whole from which the prepared hole cutting region is subtracted. Accordingly, in the second drill, buckling attributable to a cumulative increase in machining load is unlikely to occur. As a result, even if the second drill is longer in cutting length than the first drill, the risk of breakage is reduced as the machining load is reduced.

Although it is preferable that the hole drilling with the second drill is performed coaxially with the prepared hole formed by the first drill, a slight deviation is allowed within the diameter difference between the drills.

In the manufacturing method according to one aspect of the present disclosure, hole drilling with the second drill may be performed from the one surface of the electrode plate main body or the other surface of the electrode plate main body.

In this method of manufacturing an electrode plate for a plasma processing apparatus, when drilling with the second drill is performed from the other surface of the electrode plate main body, the hole is drilled in the direction opposite to when the prepared hole is formed by the first drill. Even in such a case, by the second drill forming the hole almost coaxially with the prepared hole, the machining load after reaching the prepared hole cutting region already removed from one surface is reduced by the amount corresponding to the prepared hole cutting region, and thus the overall machining load is also reduced as compared with drilling the original gas hole as a whole. When the second drill reaches a predetermined depth from the other surface, it leads to the prepared hole formed from one surface. Subsequently, in the second drill, the machining load corresponding to the prepared hole cutting region is reduced.

Accordingly, hole drilling with the second drill with the small machining load that is the original cutting region of the straight portion as a whole from which the prepared hole cutting region is subtracted is possible from the middle in the thickness direction (after reaching the prepared hole cutting region). Accordingly, in the second drill, the machining load from the middle in the thickness direction is reduced and buckling attributable to a cumulative increase in machining load is unlikely to occur. In other words, even if the second drill is longer in cutting length than the first drill, the risk of breakage is reduced as the machining load is reduced.

As for how to coaxially match the machining with the first drill and the machining with the second drill, coaxial machining can be performed by using a hole other than the gas hole as a reference hole, setting the location information thereof in a machining center (machining machine), and setting the machining positions of the first drill and the second drill to the same coordinates. The same applies in a case where hole drilling with the second drill is performed from the other surface of the electrode plate main body. In addition, as for first-to-second drill change, it is common to perform the change automatically and coaxially with an auto-change function from the drill changer (drill, tool storage) of the machining center.

In the manufacturing method according to one aspect of the present disclosure, the second drill may reach the prepared hole and form the straight portion to a middle of a thickness of the electrode plate main body in a case where hole drilling is performed from the other surface of the electrode plate main body.

The gas hole formed by this manufacturing method has a stepped hole shape in which a small-diameter hole that was a prepared hole opens in one surface of the electrode plate main body and a large-diameter hole that becomes a straight portion opens in the other surface. Also in this case, the machining load on each drill can be reduced and application to a thick electrode plate is possible.

An electrode plate for a plasma processing apparatus according to one aspect of the present disclosure is a plate where a plurality of gas holes are provided in a thickness direction of an electrode plate main body in a penetrating state and in parallel to each other, the gas hole has a straight portion exceeding 12 mm in length, and the straight portion has a diameter of 0.5 mm or more and 1.0 mm or less and a circularity of 0.01 mm or less.

According to this electrode plate for a plasma processing apparatus, the straight portion exceeds 12 mm in length, and thus the electrode plate main body is formed with a thickness of more than 12 mm and life extension can be achieved. Further, an uneven gas flow is unlikely to occur by the circularity of the straight portion being 0.01 mm or less in addition thereto.

In this electrode plate for a plasma processing apparatus, in the gas hole, a smaller-diameter part opening on one surface of the electrode plate main body and a larger-diameter part opening on the other surface communicate with each other in a middle of the thickness direction, and the larger-diameter part can be the straight portion.

Advantageous Effects of Invention

According to the method of manufacturing an electrode plate for a plasma processing apparatus according to the above aspect of the present disclosure, the risk of drill breakage can be reduced and a highly accurate gas hole can be formed even in a case where a gas hole is machined in an electrode plate for a plasma processing apparatus exceeding 12 mm in thickness. According to the electrode plate for a plasma processing apparatus, life extension can be achieved by the thick electrode plate. Further, an uneven gas flow is unlikely to occur by the circularity of the straight portion being 0.01 mm or less in addition thereto.

DESCRIPTION OF EMBODIMENTS

Hereinafter, an embodiment of the present disclosure will be described with reference to the drawings.

Figure 1:
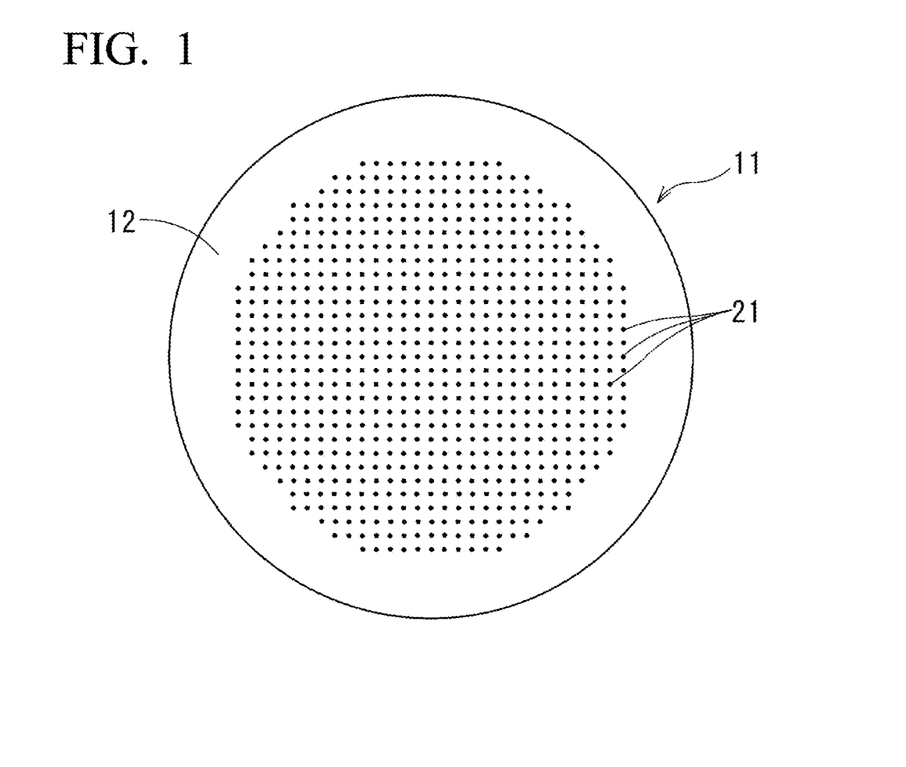
FIG. 1 is a plan view of an electrode plate for a plasma processing apparatus according to an embodiment of the present disclosure.

FIG. 1 is a plan view of an electrode plate for a plasma processing apparatus according to the embodiment of the present disclosure.

In an electrode plate 11 for a plasma processing apparatus (hereinafter, also simply referred to as "electrode plate 11"), a plurality of (in this case, several hundreds to 1,000, at least 100 or more, or at least 500 or more, etc.) gas holes 21 are formed so as to, for example, penetrate an electrode plate main body 12 in parallel in the thickness direction in a state of being aligned vertically and horizontally at a pitch of several mm to 10 mm and the electrode plate main body 12 is formed of single crystal silicon, columnar crystal silicon, or polycrystalline silicon into a disk with a thickness t of more than 12 mm and 30 mm or less and a diameter of 200 mm or more and 550 mm or less. The gas hole 21 has a straight portion 22 exceeding 12 mm in length in the thickness direction of the electrode plate main body 12. In the example shown in FIG. 2, the gas hole 21 is formed in a straight shape over the entire thickness of the electrode plate main body 12. Accordingly, the straight portion 22 of the present embodiment configures the entire length of the gas hole 21, and the length thereof exceeds 12 mm. The straight portion 22 has a diameter d of 0.5 mm or more and 1.0 mm or less and a circularity of 0.01 mm or less.

The electrode plate 11 for a plasma processing apparatus is manufactured by performing, for example, etching and polishing after forming the gas holes in the disk-shaped electrode plate main body 12 obtained by slicing a silicon ingot of single crystal silicon or the like.

The gas hole formation has a prepared hole forming step of forming a prepared hole 23 with a diameter of 50% or more and 80% or less of the diameter of the hole forming the straight portion 22 with a first drill 31 from one surface of the electrode plate main body 12 to the middle of the thickness of the electrode plate main body 12 and a straight portion forming step of forming the gas hole 21 by forming the straight portion 22 to overlap the prepared hole 23 with a second drill 32.

A drill made of a sintered material of tungsten (W), a drill obtained by diamond particle electrodeposition, a polycrystal drill of diamond, a single crystal drill of diamond, and so on can be used as the drills 31 and 32. As a result of selecting these drills, it has been found that the single crystal drill is particularly suitable with the smallest drill breakage count.

Figure 3:
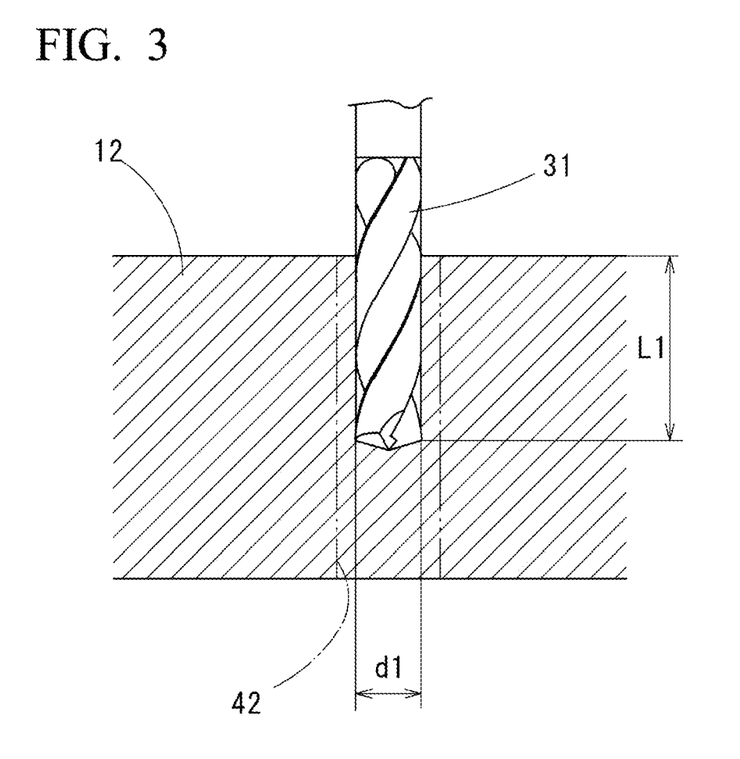
FIG. 3 is a cross-sectional view showing a state where a prepared hole is formed in a prepared hole forming step in a manufacturing method of the embodiment.

To describe the gas hole forming step in more detail, first, in the prepared hole forming step, the prepared hole 23 with an inner diameter of 50% or more and 80% or less with respect to the inner diameter of the straight portion 22 of the gas hole 21 is machined to the middle of the thickness of the electrode plate main body 12. In a case where the diameter of the straight portion 22 is 0.5 mm or more and 1.0 mm or less, the diameter of the prepared hole 23 is, for example, 0.3 mm to 0.8 mm. The prepared hole 23 is machined with the first drill 31 to the middle of the thickness of the electrode plate main body 12 to, for example, a depth L1 of approximately 8 mm. Accordingly, a diameter d1 of the first drill 31 is smaller than the diameter of the straight portion 22. FIG. 3 shows a state where the prepared hole 23 is machined with the first drill 31, and the first drill 31 is pulled out of the prepared hole 23 after the machining to the depth L1 (here, approximately 8 mm).

Figure 4:
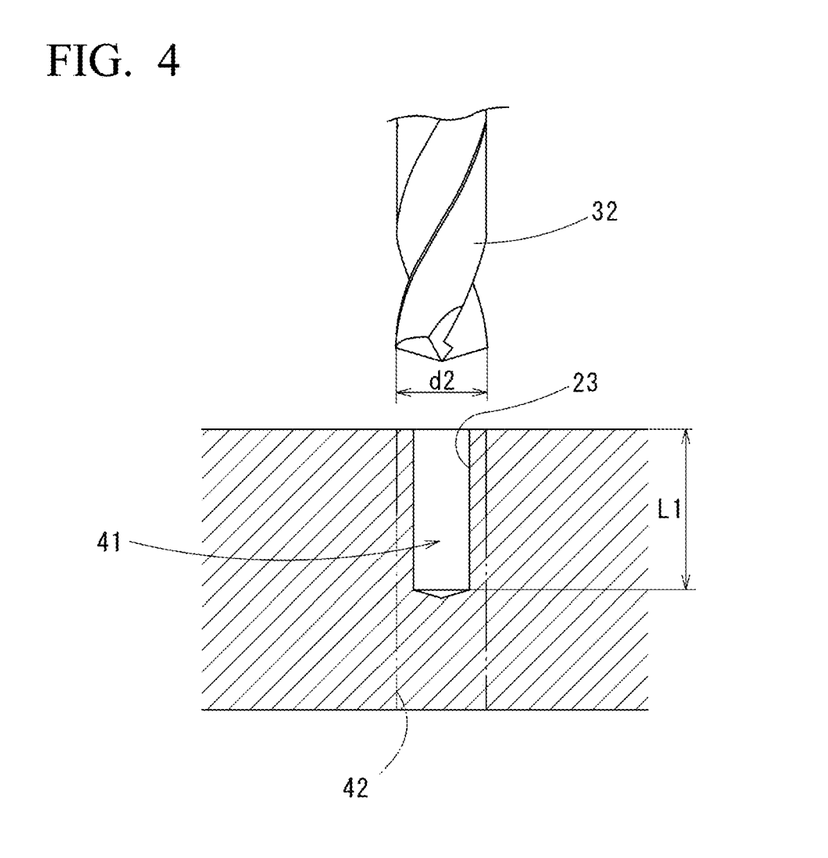
FIG. 4 is a cross-sectional view showing a state where a straight portion is formed from the same direction as the prepared hole in a straight portion forming step after the prepared hole forming step.

Next, in the straight portion forming step, the straight portion 22 with a diameter of 0.5 mm to 1.0 mm, which is larger than the prepared hole 23, is machined with the second drill 32 and penetrates the electrode plate main body 12. For example, the straight portion 22 is formed with a diameter exceeding the diameter of the prepared hole 23 by approximately 0.2 mm (0.1 mm on each side). Accordingly, a diameter d2 of the second drill 32 is larger than the diameter d1 of the first drill 31.

In FIGS. 3 and 4, a prepared hole cutting region 41 formed in the prepared hole forming step is indicated by a solid line, and a straight portion cutting region 42 to be formed in the straight portion forming step is indicated by a dashed line. With the second drill 32 in the example shown in FIGS. 3 and 4, hole drilling is performed coaxially with the prepared hole 23 from the same direction as the first drill 31 at the time when the prepared hole 23 is machined. In the straight portion forming step, the hole drilling with the second drill 32 is performed until the electrode plate main body 12 is penetrated. Accordingly, the straight portion 22 is formed over the entire thickness of the electrode plate main body 12.

In the above manufacturing method, before the gas hole 21 is formed in the electrode plate main body 12, the prepared hole 23 with an inner diameter of 50% or more and 80% or less with respect to the inner diameter of the straight portion 22 of the gas hole 21 is formed to the middle in the thickness direction. Since the prepared hole 23 may be formed to the middle of the electrode plate main body 12 in the thickness direction, the cutting length of the first drill 31 may be shorter than the thickness of the electrode plate main body 12. In other words, the first drill 31 for the prepared hole is small in diameter but short and thus hard to break.

Although the second drill 32 is larger in diameter and longer in length than the first drill 31 and exceeds 12 mm in linear length, the hole drilling with the second drill 32 may be performed from above the prepared hole 23 made by the first drill 31 until the electrode plate main body 12 is penetrated coaxially with the prepared hole 23. In other words, by performing the hole drilling coaxially with the prepared hole 23, the machining load corresponding to the already-removed prepared hole cutting region 41 is reduced. Accordingly, the hole drilling with the second drill 32 can be performed with the small machining load that is the original cutting region of the gas hole 21 (straight portion 22) as a whole from which the prepared hole cutting region 41 is subtracted. Accordingly, in the second drill 32, buckling attributable to a cumulative increase in machining load is unlikely to occur. As a result, even if the second drill 32 is longer in cutting length than the first drill 31, the risk of breakage is reduced as the machining load is reduced. In this manner, the first drill 31 and the second drill 32 have different drill diameters. Accordingly, the gas hole 21 of the electrode plate main body 12 is a hole formed by at least two drills having different drill diameters (for example, the first drill 31 and the second drill 32).

Although it is preferable that the hole drilling with the second drill 32 is performed coaxially with the prepared hole 23 formed by the first drill 31, a slight deviation is allowed within the diameter difference between the drills 31 and 32.

The depth of machining of the prepared hole 23 with the first drill 31 is preferably more than 5 mm and less than 15 mm whereas the length of the straight portion 22 is more than 12 mm and 30 mm or less. At a shallow machining depth of the prepared hole 23 (5 mm or less), the machining load on the second drill 32 cannot be reduced, which may cause the second drill 32 to break or result in a decline in circularity. At a deep machining depth of the prepared hole 23, the machining load on the first drill 31 increases, which causes the first drill 31 to break. 7 mm or more and 13 mm or less is more preferable. Accordingly, at a thickness of the electrode plate main body 12 of less than 15 mm, preferably 13 mm or less, the prepared hole 23 prepared with the first drill 31 may be formed so as to penetrate the electrode plate main body 12.

In the electrode plate 11 obtained by this manufacturing method, the gas hole 21 has the straight portion 22 exceeding 12 mm in length. In the example shown in FIG. 2, the entire length of the gas hole 21 is the straight portion 22. The straight portion 22 has a diameter of 0.5 mm or more and 1.0 mm or less and a circularity of 0.01 mm or less.

According to the electrode plate 11, the length of the straight portion 22 exceeds 12 mm, and thus the electrode plate main body 12 is formed with a thickness exceeding 12 mm and the life thereof can be extended. Further, an uneven gas flow is unlikely to occur by the circularity of the straight portion 22 being 0.01 min or less in addition thereto.

The following methods are also conceivable in a case where hole drilling is performed with two drills.

(1) Method by which the outer diameters of the two drills are the same outer diameter at which final gas hole formation is possible, hole drilling with the first drill is performed at the middle of the thickness of an electrode plate main body, and second hole drilling with the second drill is performed from above the hole to penetrate the electrode plate main body (2) Method by which the outer diameters of the two drills are the same outer diameter at which final gas hole formation is possible, first hole drilling with the first drill is performed at the middle of the thickness of an electrode plate main body, and second hole drilling is performed from the end portion of the hole drilled first with the tip portion of the second drill inserted in the hole to penetrate the electrode plate main body In these methods (1) and (2), a drill with a short cutting length can be used for the first hole drilling, and thus the risk of drill breakage is small. However, a positional deviation is likely to occur between the holes machined first and second, a strain is likely to occur at the opening end of the hole, and a decline in hole circularity is likely to arise. Besides, there is a risk of breakage by the drill swinging during the second hole drilling.

In the present disclosure, the hole drilling with the second drill 32 may be performed from the same direction as the first drill 31 by which the prepared hole 23 is formed as described above or may be performed from the surface of the electrode plate main body 12 on the side opposite to the first drill 31.

Figure 2:
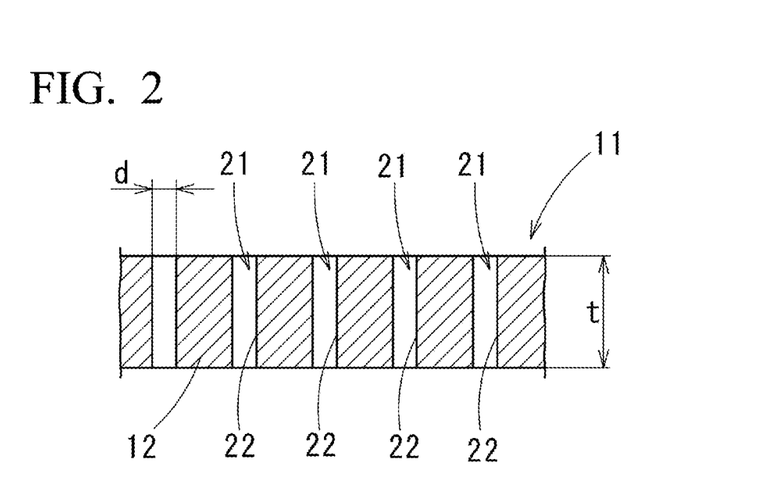
FIG. 2 is a vertical cross-sectional view of a main part of FIG. 1.
Figure 5:
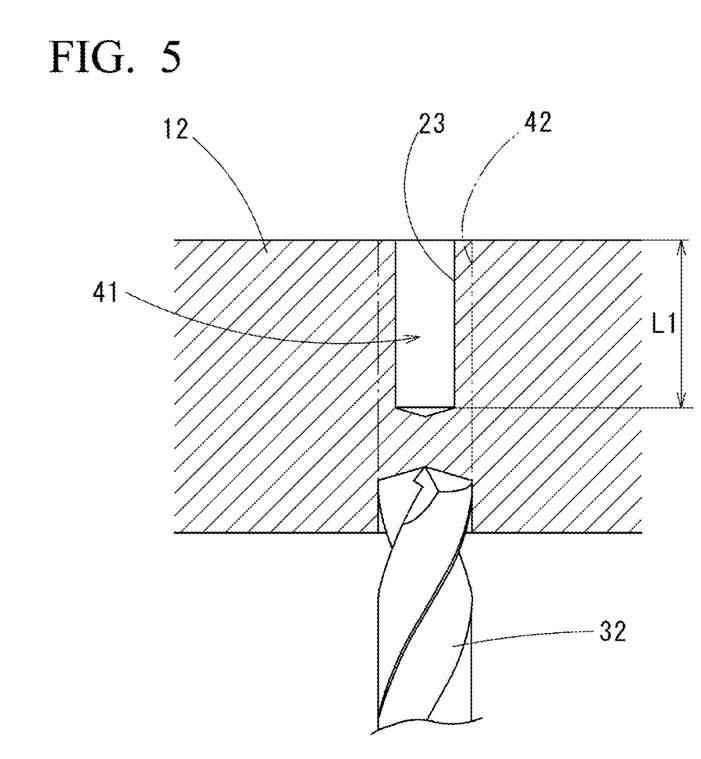
FIG. 5 is a cross-sectional view showing a state where the straight portion is formed from the direction opposite to the prepared hole in the straight portion forming step after the prepared hole forming step.

FIG. 5 shows an example in which the second drill 32 for machining the straight portion 22 is formed from the direction opposite to the direction of formation of the prepared hole 23. Similarly to FIG. 3, hole drilling with the first drill 31 is performed at the middle in the thickness direction from one surface of the electrode plate main body 12 to form the prepared hole 23. On the other hand, hole drilling with the second drill 32 is performed coaxially with the prepared hole 23 from the other surface of the electrode plate main body 12 (surface opposite to or facing one surface) until the electrode plate main body 12 is penetrated. As a result, the straight portion 22 penetrating the electrode plate main body 12 is formed over the entire thickness of the electrode plate main body 12. Accordingly, the shape of the formed gas hole 21 is the same as the case of machining shown in FIGS. 3 and 4 and is straight as shown in FIG. 2.

In the present disclosure, the straight portion 22 does not necessarily have to be formed with a length at which the electrode plate main body 12 is penetrated.

Figure 6:
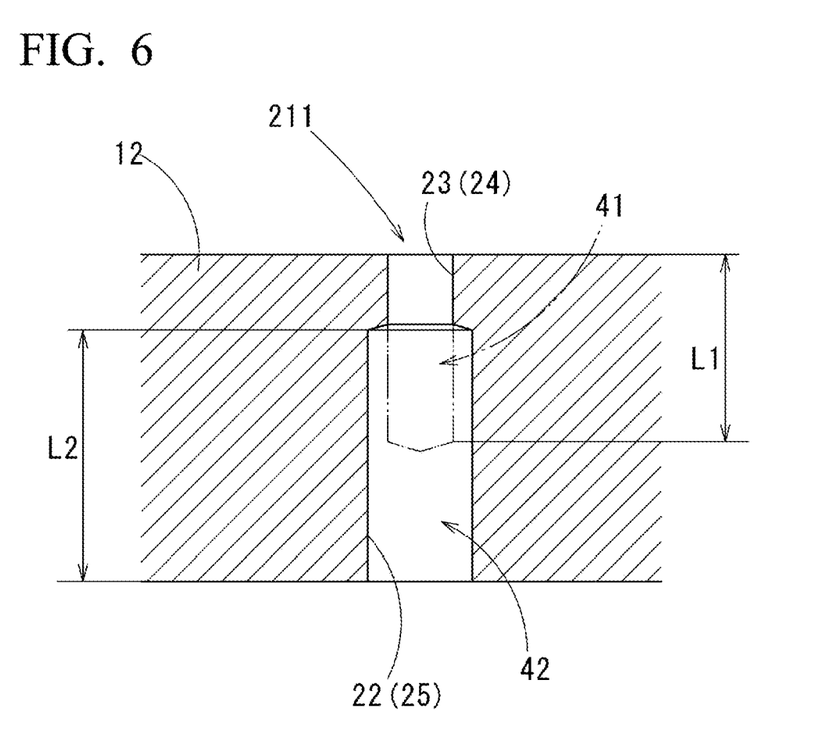
FIG. 6 is a cross-sectional view showing an example in which a stepped gas hole results from the prepared hole and the straight portion.

In FIG. 6 as well as FIG. 5, the straight portion 22 is formed from the opposite side of the electrode plate main body 12 with respect to the prepared hole 23. However, in FIG. 6, the straight portion 22 also reaches the middle of the thickness of the electrode plate main body 12 with a depth L2 of reaching the tip portion of the prepared hole 23 and, as a result, a stepped gas hole 211 is formed in which the prepared hole 23 and the straight portion 22 communicate with each other.

In this case, the prepared hole 23 is a smaller-diameter part 24 formed from one surface side of the electrode plate main body 12 to the middle in the thickness direction. The straight portion 22 is a larger-diameter part 25 formed from the other surface side of the electrode plate main body 12 to the middle of the electrode plate main body 12 in the thickness direction so as to be coaxial and communicate with the smaller-diameter part 24. As a result, the electrode plate main body 12 is formed with the stepped gas hole 211 in which the smaller-diameter part 24 and the larger-diameter part 25 are connected.

The gas holes 21 and 211 formed by the above methods shown in FIGS. 3 to 6 have the straight portion 22 exceeding 12 mm in length, the diameter of the straight portion 22 is 0.5 mm or more and 1.0 mm or less, and the circularity of the straight portion 22 is 0.01 mm or less.

Figure 7:
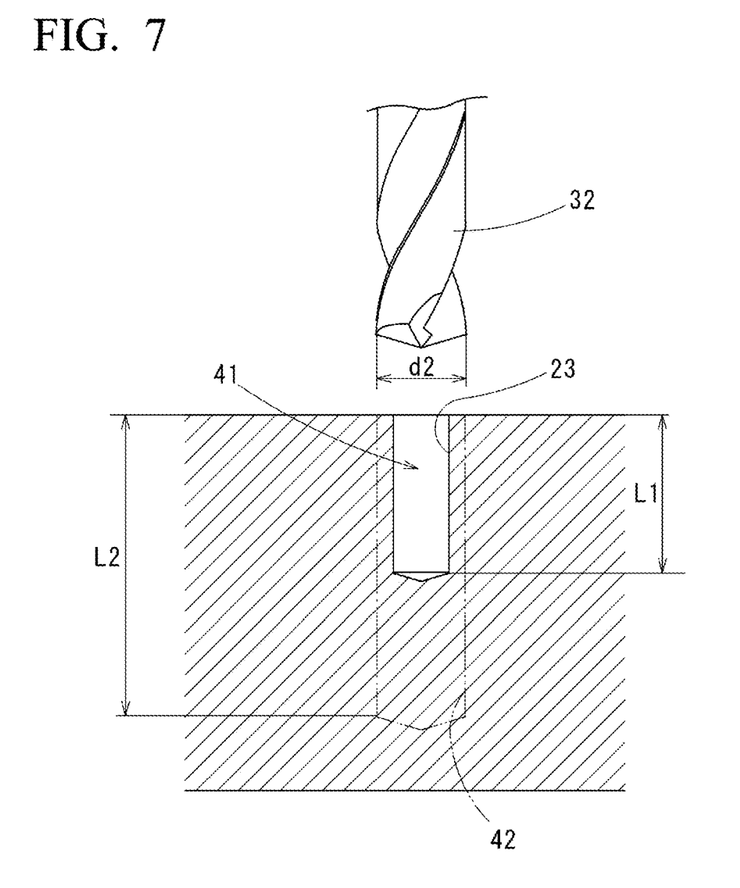
FIG. 7 is a cross-sectional view showing a state where a second drill is disposed in order to form the straight portion to the middle of an electrode plate main body in the thickness direction after the prepared hole forming step.
Figure 8:
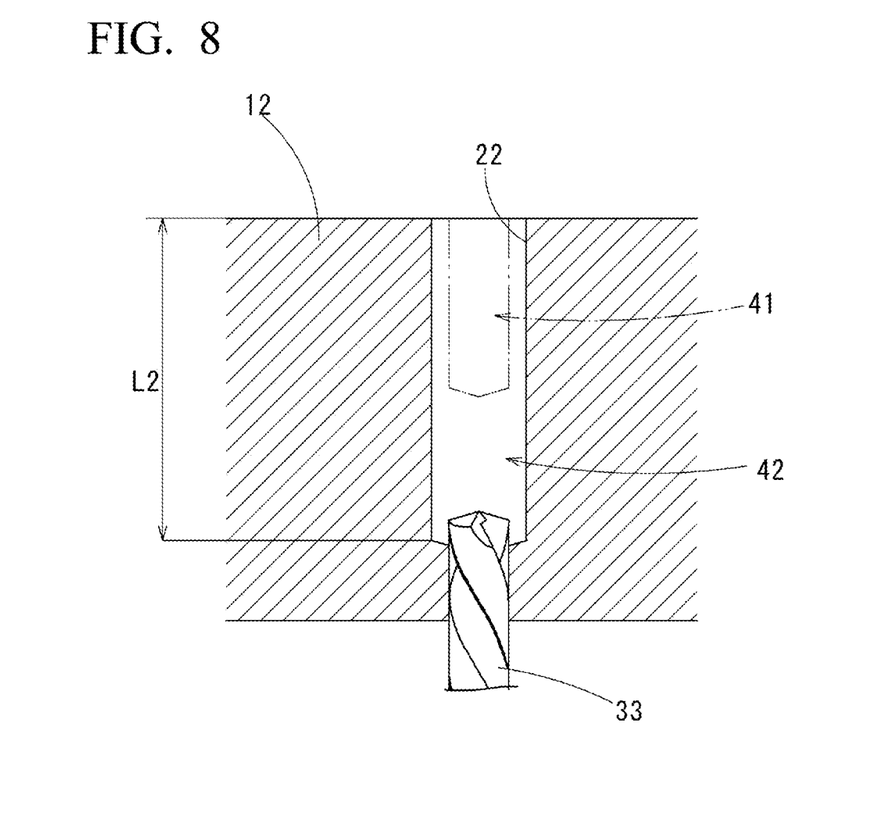
FIG. 8 is a cross-sectional view showing a state where a hole smaller in diameter than the straight portion is formed by a third drill in the straight portion formed to the middle of the electrode plate main body in the thickness direction.
Figure 9:
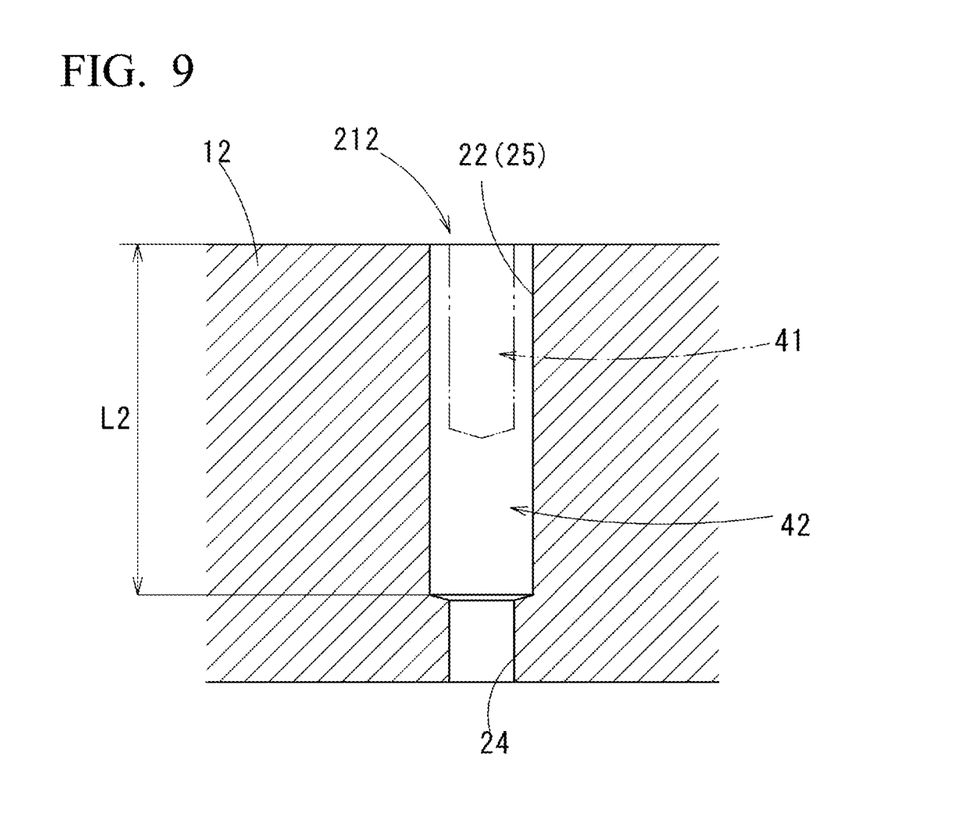
FIG. 9 is a cross-sectional view showing a stepped gas hole formed by the method shown in FIG. 8.

In a case where a stepped gas hole is formed, the hole may be formed by the method shown in FIGS. 7 to 9.

In the method of this example, first, as shown in FIG. 7, the straight portion 22 is coaxially formed with the second drill 32, from the same direction, within the range of the length L2, and to the middle of the thickness of the electrode plate main body 12 (see FIG. 8) with respect to the prepared hole cutting region 41 formed from one surface of the electrode plate main body 12 to the middle in the thickness direction with the first drill 31 (not shown in FIGS. 7 to 8, see FIG. 3). The state shown in FIG. 9 is obtained by performing coaxial hole drilling with a third drill 33 from the other surface of the electrode plate main body 12 at a depth at which the straight portion cutting region 42 is reached. In the example shown in FIGS. 7 to 9, the third drill 33 is smaller in diameter than the second drill 32, and thus the straight portion 22 is the larger-diameter part 25, the hole formed by the third drill 33 is the smaller-diameter part 24, and these are a stepped gas hole 212 of communication at the middle position of the thickness of the electrode plate main body 12. Also in this case, the straight portion 22 is formed with the length L2 exceeding 12 mm.

Although the third drill 33 is smaller in diameter than the second drill 32, a hole communicating with the straight portion 22 may be machined using the third drill that is larger in diameter than the second drill 32, which is not shown. Then, the straight portion 22 can be a smaller-diameter part and the hole formed by the third drill 33 can be a larger-diameter part.

EXAMPLES

Specimens were prepared by the following hole drilling methods, hole drilling was performed, and then image processing was performed using a three-dimensional image measuring machine manufactured by Mitutoyo Co., Ltd. (Quick Vision QVX606-PRO manufactured by Mitutoyo Co., Ltd.) to perform hole diameter and circularity measurement in the opening portion on the second drill inlet side and confirm the presence or absence of drill breakage during machining. The test was performed 5 times (5 holes were drilled), the average hole diameter and circularity values were obtained, and the number of times of drill breakage in the 5 tests was examined. Cases of breakage were excluded from the measurement specimens.

Example 1

Aiming at a diameter of 0.8 mm, a straight hole is formed in a penetrating state in an electrode plate main body with a thickness of 20 mm.
(1) Conventional Example Machining Method A
  A drill with a diameter of 0.8 mm and a cutting length of 20 mm was used to drill holes at once from one surface of the electrode plate main body.
(2) Comparative Example Machining Method A
  A prepared hole with a depth of 10 mm was machined from one surface of the electrode plate main body with a drill with a diameter of 0.8 mm and a cutting length of 10 mm (first drill: also in the comparative example, the initial drill is the first drill and the next drill is the second drill, the same applies below), and then hole drilling for a depth of 20 mm was performed with a drill (second drill) with a diameter of 0.8 mm and a cutting length of 20 mm from one surface of the electrode plate main body so as to include the prepared hole to penetrate the electrode plate main body.
(3) Comparative Example Machining Method B
  A prepared hole with a depth of 10 mm was machined from one surface of the electrode plate main body with the drill (first drill) with a diameter of 0.8 mm and a cutting length of 10 mm, and then the tip portion of the drill (second drill) with a diameter of 0.8 mm and a cutting length of 20 mm was inserted into the prepared hole and hole drilling for a depth of 10 mm was performed from a depth position of 10 mm to penetrate the electrode plate main body.
(4) Example Machining Method A
  A prepared hole with a depth of 10 mm was machined from one surface of the electrode plate main body with the first drill with a diameter of 0.6 mm and a cutting length of 10 mm, and then hole drilling for a depth of 20 mm was performed with the second drill with a diameter of 0.8 mm and a cutting length of 20 mm from one surface of the electrode plate main body so as to include the prepared hole to penetrate the electrode plate main body.

The results are shown in Table 1. The evaluation of the drill breakage of the conventional example is described in the column of the first drill (the same applies to Tables 2 and 3).

TABLE 1

| | Hole diameter (mm) | Circularity (mm) | First drill breakage | Second drill breakage |
|---|---|---|---|---|
| Conventional Example A | — | — | 5/5 | — |
| Comparative Example A | 0.818 | 0.073 | 0/5 | 3/5 |
| Comparative Example B | 0.814 | 0.065 | 0/5 | 3/5 |
| Example A | 0.802 | 0.005 | 0/5 | 0/5 |

In Conventional Example A, the hole diameter and circularity were not measured because the drill was broken in all of the five tests.

In both Comparative Examples A and B, the drill (second drill) was broken in three out of the five tests, the hole diameter had a large error with respect to the target hole diameter, and the circularity was poor.

On the other hand, in the machining method of Example A, drill breakage was not observed at all, the error in the hole diameter of the machined hole was small, and a small-circularity hole could be machined.

Example 2

Aiming at a diameter of 0.8 mm, a straight hole is formed in a penetrating state in an electrode plate main body with a thickness of 30 mm.
(1) Conventional Example Machining Method B
  A drill with a diameter of 0.8 mm and a cutting length of 30 mm was used to drill holes at once from one surface of the electrode plate main body.
(2) Comparative Example Machining Method C
  A prepared hole with a depth of 10 mm was machined from one surface of the electrode plate main body with a drill (first drill) with a diameter of 0.8 mm and a cutting length of 10 mm, and then hole drilling for a depth of 30 mm was performed with a drill (second drill) with a diameter of 0.8 mm and a cutting length of 30 mm from one surface of the electrode plate main body so as to include the prepared hole to penetrate the electrode plate main body.
(3) Comparative Example Machining Method D
  A prepared hole with a depth of 10 mm was machined from one surface of the electrode plate main body with the drill (first drill) with a diameter of 0.8 mm and a cutting length of 10 mm, and then the tip portion of the drill (second drill) with a diameter of 0.8 mm and a cutting length of 30 mm was inserted into the prepared hole and hole drilling for a depth of 20 mm was performed from a depth position of 10 mm to penetrate the electrode plate main body.
(4) Example Machining Method B
  A prepared hole with a depth of 10 mm was machined from one surface of the electrode plate main body with the first drill with a diameter of 0.6 mm and a cutting length of 10 mm, and then hole drilling for a depth of 30 mm was performed with the second drill with a diameter of 0.8 mm and a cutting length of 30 mm from one surface of the electrode plate main body so as to include the prepared hole to penetrate the electrode plate main body.

The results are shown in Table 2.

TABLE 2

|  | Hole diameter (mm) | Circularity (mm) | First drill breakage | Second drill breakage |
|---|---|---|---|---|
| Conventional Example B | — | — | 5/5 | — |
| Comparative Example C | — | — | 0/5 | 5/5 |
| Comparative Example D | — | — | 0/5 | 5/5 |
| Example B | 0.801 | 0.009 | 0/5 | 0/5 |

The drill was broken in all of the five tests in Conventional Example B, the second drill was broken in all of the five tests in Comparative Examples C and D, and thus the hole diameter and circularity were not measured in the examples.

In the machining method of Example B, drill breakage was not observed at all, the error in the hole diameter of the machined hole was small, and a small-circularity hole could be machined. As described above, the method of the present disclosure is also effective for machining a gas hole that has a straight portion with a length of 30 mm.

Example 3

Aiming at a diameter of 0.8 mm, a straight hole is formed in a penetrating state in an electrode plate main body with a thickness of 13 mm.

(1) Conventional Example Machining Method C

A drill with a diameter of 0.8 mm and a cutting length of 13 mm was used to drill holes at once from one surface of the electrode plate main body.

(2) Comparative Example Machining Method E

A prepared hole with a depth of 10 mm was machined from one surface of the electrode plate main body with a drill (first drill) with a diameter of 0.8 mm and a cutting length of 10 mm, and then hole drilling for a depth of 13 mm was performed with a drill (second drill) with a diameter of 0.8 mm and a cutting length of 13 mm from one surface of the electrode plate main body so as to include the prepared hole to penetrate the electrode plate main body.

(3) Comparative Example Machining Method F

A prepared hole with a depth of 10 mm was machined from one surface of the electrode plate main body with the drill (first drill) with a diameter of 0.8 mm and a cutting length of 10 mm, and then the tip portion of the drill (second drill) with a diameter of 0.8 mm and a cutting length of 13 mm was inserted into the prepared hole and hole drilling for a depth of 3 mm was performed from a depth position of 10 mm to penetrate the electrode plate main body.

(4) Example Machining Method C

A prepared hole with a depth of 10 mm was machined from one surface of the electrode plate main body with the first drill with a diameter of 0.6 mm and a cutting length of 10 mm, and then hole drilling for a depth of 13 mm was performed with the second drill with a diameter of 0.8 mm and a cutting length of 13 mm from one surface of the electrode plate main body so as to include the prepared hole to penetrate the electrode plate main body.

(5) Example Machining Method D

A prepared hole (penetration) with a depth of 13 mm was machined from one surface of the electrode plate main body with the first drill with a diameter of 0.6 mm and a cutting length of 13 mm, and then hole drilling for a depth of 13 mm was performed with the second drill with a diameter of 0.8 mm and a cutting length of 13 mm from one surface of the electrode plate main body so as to include the prepared hole to manufacture an electrode plate main body.

The results are shown in Table 3.

TABLE 3

|  | Hole diameter (mm) | Circularity (mm) | First drill breakage | Second drill breakage |
|---|---|---|---|---|
| Conventional Example C | 0.805 | 0.015 | 3/5 | — |
| Comparative Example E | 0.808 | 0.035 | 0/5 | 1/5 |
| Comparative Example F | 0.807 | 0.040 | 0/5 | 1/5 |
| Example C | 0.802 | 0.003 | 0/5 | 0/5 |
| Example D | 0.803 | 0.003 | 1/5 | 0/4 |

Although the drill was broken in three out of the five tests in the conventional example C and the second drill was broken in one of the five tests in Comparative Examples E and F, the hole machining depth was smaller than in Examples 1 and 2 and thus there was little drill breakage and hole drilling could be performed, and yet the formed hole has a large hole diameter error and the circularity is not satisfactory, either. Although it is conceivable that the hole drilling with the second drill of Comparative Example F is machining for a depth of 3 mm and the load is small, it was easy to swing in the hole made first, and thus breakage occurred in one of the five tests.

In Example C, none of the drills was broken, the hole diameter error was small, and the circularity was also small.

In Example D, breakage in the first drill was observed in one of the five tests, but the hole diameter error was small and the circularity was also small.

As is clear from the above examples, according to the manufacturing method of the present disclosure, a hole that has a straight portion exceeding 12 mm in length can be formed with high accuracy (small circularity) even with a thick electrode plate main body.

INDUSTRIAL APPLICABILITY

According to the method of manufacturing an electrode plate for a plasma processing apparatus of the present disclosure, the risk of drill breakage can be reduced and a highly accurate gas hole can be formed even in a case where a gas hole is machined in an electrode plate for a plasma processing apparatus exceeding 12 mm in thickness. According to the electrode plate for a plasma processing apparatus, life extension can be achieved by the thick electrode plate. Further, an uneven gas flow is unlikely to occur by the circularity of the straight portion being 0.01 mm or less in addition thereto.

REFERENCE SIGNS LIST

11: Electrode plate (electrode plate for plasma processing apparatus)
12: Electrode plate main body
21, 211, 212: Gas hole
22: Straight portion
23: Prepared hole
24: Smaller-diameter part
25: Larger-diameter part 31: First drill
32: Second drill
41: Prepared hole cutting region
42: Straight portion cutting region

What is claimed is:

1. A method of manufacturing an electrode plate for a plasma processing apparatus for forming a plurality of gas holes having a straight portion exceeding 12 mm in length in a thickness direction of an electrode plate main body in a penetrating state and in parallel to each other, the method comprising:
    a prepared hole forming step of forming a prepared hole with a diameter of 50% or more and 80% or less of a diameter of a hole forming the straight portion with a first drill from one surface of the electrode plate main body; and
    a straight portion forming step of forming the straight portion to overlap the prepared hole with a second drill,
    wherein the electrode plate main body consists of single crystal silicon, columnar crystal silicon, or polycrystalline silicon,
    a diameter of the second drill is larger than a diameter of the first drill, and
    the straight portion forming step is conducted after the prepared hole forming step.

2. The method of manufacturing an electrode plate for a plasma processing apparatus according to claim 1,
    wherein the prepared hole is formed to a middle of a thickness of the electrode plate main body.

3. The method of manufacturing an electrode plate for a plasma processing apparatus according to claim 1,
    wherein the prepared hole has a machining depth of more than 5 mm.

4. The method of manufacturing an electrode plate for a plasma processing apparatus according to claim 1,
    wherein hole drilling with the second drill is performed from the one surface of the electrode plate main body.

5. The method of manufacturing an electrode plate for a plasma processing apparatus according to claim 1,
    wherein hole drilling with the second drill is performed from the other surface of the electrode plate main body.

6. The method of manufacturing an electrode plate for a plasma processing apparatus according to claim 5,
    wherein the second drill reaches the prepared hole and forms the straight portion to a middle of a thickness of the electrode plate main body.

7. An electrode plate for a plasma processing apparatus where a plurality of gas holes are provided in a thickness direction of an electrode plate main body in a penetrating state and in parallel to each other,
    wherein the electrode plate main body consists of single crystal silicon, columnar crystal silicon, or polycrystalline silicon,
    the gas hole is a straight portion which is straight over the entire thickness of the electrode plate body and exceeds 12 mm in length,
    in the straight portion, a diameter of an opening on a plasma side is 0.5 mm or more and 1.0 mm or less and a circularity of the opening on the plasma side is 0.01 mm or less.

8. An electrode plate for a plasma processing apparatus where a plurality of gas holes are provided in a thickness direction of an electrode plate main body in a penetrating state and in parallel to each other,
    wherein the electrode plate main body consists of single crystal silicon, columnar crystal silicon, or polycrystalline silicon,
    in the gas hole, a smaller-diameter part opening on one surface of the electrode plate main body and a larger-diameter part opening on the other surface which is a plasma side communicate with each other in a middle of the thickness direction,
    the larger-diameter part is a straight portion exceeding 12 mm in length, and
    the straight portion is open on the other surface which is the plasma side, a diameter of an opening on the plasma side is 0.5 mm or more and 1.0 mm or less, and a circularity of the opening on the plasma side is 0.01 mm or less.

9. The method of manufacturing an electrode plate for a plasma processing apparatus according to claim 2,
    wherein the prepared hole has a machining depth of more than 5 mm.

10. The method of manufacturing an electrode plate for a plasma processing apparatus according to claim 2,
    wherein hole drilling with the second drill is performed from the one surface of the electrode plate main body.

11. The method of manufacturing an electrode plate for a plasma processing apparatus according to claim 3,
    wherein hole drilling with the second drill is performed from the one surface of the electrode plate main body.

12. The method of manufacturing an electrode plate for a plasma processing apparatus according to claim 9,
    wherein hole drilling with the second drill is performed from the one surface of the electrode plate main body.

13. The method of manufacturing an electrode plate for a plasma processing apparatus according to claim 2,
    wherein hole drilling with the second drill is performed from the other surface of the electrode plate main body.

14. The method of manufacturing an electrode plate for a plasma processing apparatus according to claim 3,
    wherein hole drilling with the second drill is performed from the other surface of the electrode plate main body.

15. The method of manufacturing an electrode plate for a plasma processing apparatus according to claim 9,
    wherein hole drilling with the second drill is performed from the other surface of the electrode plate main body.

16. The method of manufacturing an electrode plate for a plasma processing apparatus according to claim 13,
    wherein the second drill reaches the prepared hole and forms the straight portion to a middle of a thickness of the electrode plate main body.

17. The method of manufacturing an electrode plate for a plasma processing apparatus according to claim 14,
    wherein the second drill reaches the prepared hole and forms the straight portion to a middle of a thickness of the electrode plate main body.

18. The method of manufacturing an electrode plate for a plasma processing apparatus according to claim 15,
    wherein the second drill reaches the prepared hole and forms the straight portion to a middle of a thickness of the electrode plate main body.

* * * * *